United States Patent [19]
Phillips et al.

[11] Patent Number: 4,513,179
[45] Date of Patent: Apr. 23, 1985

[54] LOOP TEST CIRCUIT

[75] Inventors: Lot Phillips, Brookline; Hollis B. Austin, Manchester; Kenneth S. Blakeslee, Sutton, all of N.H.

[73] Assignee: Northern Telecom Limited, Montreal, Canada

[21] Appl. No.: 487,057

[22] Filed: Apr. 21, 1983

[51] Int. Cl.³ .............................................. H04B 3/46
[52] U.S. Cl. ........................................... 179/175.3 R
[58] Field of Search ............... 179/175.1 R, 175.2 C, 179/175.2 R, 175.3 R, 175.3 A, 175.3 F, 175, 51 DA, 81 C; 324/51, 52, 53, 133

[56] References Cited
U.S. PATENT DOCUMENTS

| | | | |
|---|---|---|---|
| 3,806,803 | 4/1974 | Hall | 324/133 |
| 3,922,507 | 11/1975 | White | 179/175.3 R |
| 3,941,950 | 3/1976 | Dunwoodie et al. | 179/175.3 R |
| 3,976,849 | 8/1976 | Champan | 179/175.25 |

FOREIGN PATENT DOCUMENTS

| | | |
|---|---|---|
| 2910897 | 10/1980 | Fed. Rep. of Germany . |
| 2913395 | 10/1980 | Fed. Rep. of Germany . |
| 7128905 | 3/1973 | France . |

OTHER PUBLICATIONS

8140 Wireless World, vol. 85, No. 1527 (1979-11), p. 91, Haywards Heath, GB, C. J. Challender: "Reference Voltage Indicator."

Primary Examiner—Stafford D. Schreyer
Attorney, Agent, or Firm—Schwartz, Jeffery, Schwaab, Mack, Blumenthal & Koch

[57] ABSTRACT

A test circuit for testing tip and ring conditions of a loop circuit has three test links which exclusively turn on one of a plurality of light emitters to indicate a normal loop current, low current or polarity reversal condition. The circuit is energized by current within the loop and is mounted within an easily portable and manipulable body.

12 Claims, 4 Drawing Figures

LOOP TEST CIRCUIT

This invention relates to a test instrument particularly adapted for checking the integrity of a circuit which terminates at a wall or other socket and to which other equipment is intended to be connected using a jack. The invention has particular application to an instrument for testing the parameters of a telephone loop circuit terminating at a wall socket.

To an increasing extent, telephone equipment used by the subscriber, instead of being owned and installed by the area telephone operating company is owned and installed by the subscriber, the only requirement being that the subscribed equipment be compatible with the area telephone company's transmission and switching equipment. In a situation like this where a fault appears on the subscriber's line it is important for the telephone company and the subscriber to know whether the fault has occured in the subscriber's own equipment or exists in the telephone company's equipment. Basically a simple and easy test must be carried out and the place to carry out that test is at the interface between the two equipments.

As a general policy telephone companies are now installing loops which terminate at a wall socket adapted to mate with a modular jack which is attached by a flexible cable to the telephone. A test instrument is now proposed specifically for use in conjunction with a wall socket which terminates a telephone or other electrical circuit.

According to the invention there is provided an electrical test circuit for use in testing tip and ring conditions of a telephone subscriber's loop, the circuit comprising a pair of terminals connectable to tip and ring respectively and three light emitting means connected across the terminals and selectively energizable by loop current, the first light emitting means energized by a reverse polarity condition of tip and ring, the second light emitting means energized by an abnormal low current, forward polarity condition of tip and ring, and the third light emitting means energized by a correct current, forward polarity condition of tip and ring.

Preferably the test circuit is passive and is energized completely by current within the loop. The light emitting means are preferably light emitting diodes which can be colour coded according to their particular indicator functions. The first light emitting diode can be connected between the tip and ring terminals with an appropriate polarity to conduct when tip and ring voltages are reversed, the first light emitting diode being series connected with a resistor.

The second and third light emitting diodes can be respectively connected within the collector circuit of transistors of a differential amplifier. A first divider network can supply bias voltage depending on the tip-to-ring voltage to the base of the first transistor; and a second divider network can supply a fixed voltage to the second transistor base. The transistor emitters can be common connected through a bias resistor to the ring voltage. The circuit components values are preferably chosen such that the second light emitting diode emits when tip-to-ring current is greater than 5 milliamperes but less than 20 milliamperes and the third light emitting diode emits when the tip-to-ring current is greater than 20 milliamperes. The transistors can be provided with an emitter to base diode to guard against damage caused by a high reverse bias. Back-to-back zener diodes can be provided in a further link between the tip and ring terminals to provide overload protection.

The test and indicating circuitry can be contained in a test instrument comprising a barrel portion, a rigid connector portion mateable with a corresponding connector portion terminating a circuit to be tested, and a flexible neck portion joining the rigid connector portion to the barrel portion, the neck portion having mounted thereto leads interconnecting the rigid connector portion and the test and indicating circuitry within the barrel portion.

An embodiment of the invention will now be described by way of example with reference to the accompanying drawings in which.

Figure 1:
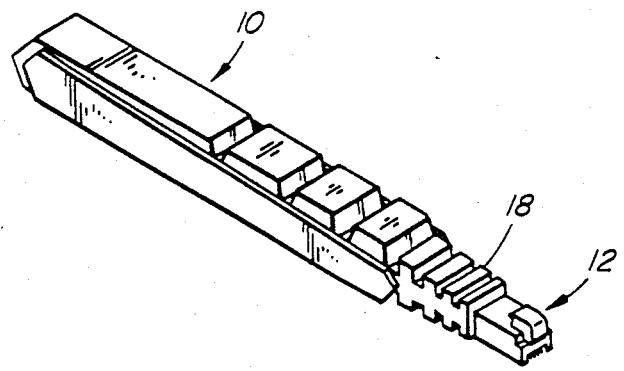
FIG. 1 is a perspective view of a test instrument according to the invention.
Figure 2:
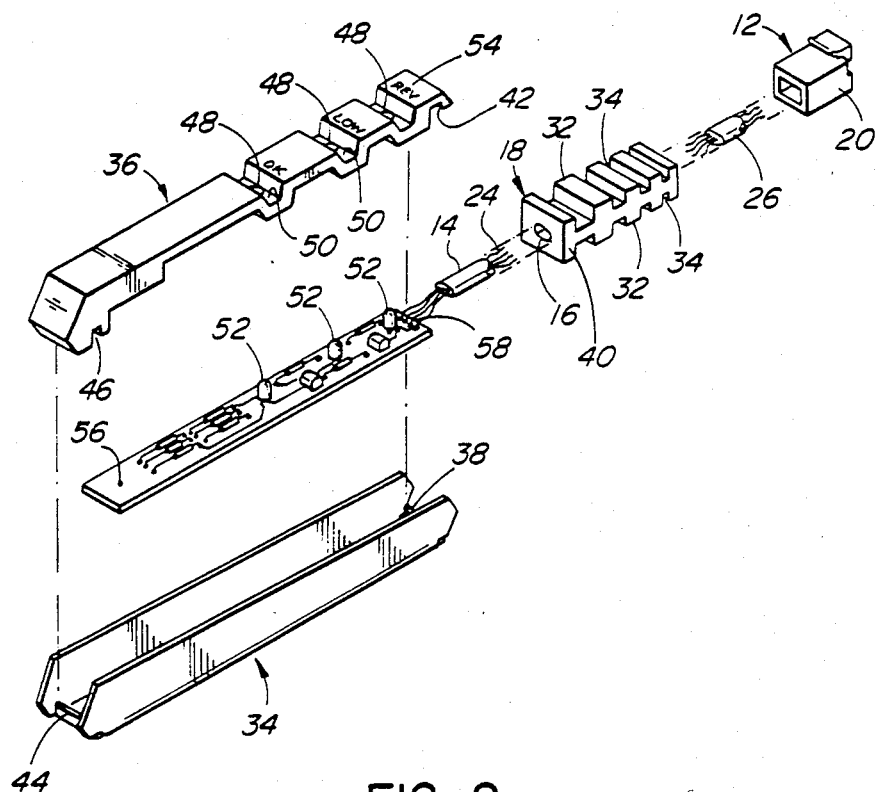
FIG. 2 is an exploded view of the FIG. 1 test instrument.

Referring to FIGS. 1 and 2 in detail, the telephone line checking instrument shown has a square section barrel part 10, a jack member 12 forming one part of a modular jack assembly, the other part (not shown) of the modular jack assembly terminating a telephone subscriber's loop at a wall fitting in the subscriber's premises. The barrel part and the jack member are joined by a flexible cable 14 extending through a passage 16 within a block 18 of an elastomer.

Figure 2A:
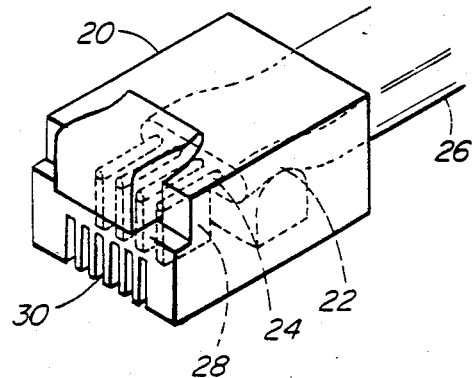
FIG. 2a shows a detail of the FIG. 1 test instrument.

Referring in detail to the exploded view of FIG. 2, the jack or male member has a shaped plastic body 20 with projections adapted to ensure correct insertion into corresponding wall mounted female member of the modular jack assembly. The cable 14 enters the body 20 through an aperture in the rear of the body and is locked there following molding of the polycarbonate body 20 by crimping, causing a part of the body to extend into a depression 22 in the cable (FIG. 2a). Conductors 24 project beyond the end of cable sheath 26 and terminate at contact members 28 which are crimped to the individual bared conductors 24 and which are accommodated within grooves 30 in the molded body 20. In use, the jack slides into a wall socket where there are corresponding contact members which locate within those parts of the grooves 30 which are not filled by the contact members shown. The respective contact members are thus in side-by-side abutment.

The elastomer 18 has a square section to lend aesthetic continuity throughout the instrument, the barrel part 10 and the jack member 12 also having a substantially rectangular cross-section. The elastomer body 18 is formed with ribs 32 to optimize strength and stress relief when the elastomer block is subjected to shear forces on twisting. The ribs 32 and intervening grooves 34 are more densely located near the front end of the block than at the rear since this is the end required to be most flexible.

Although in this embodiment conductors 24 are taken through the center of the elastomer block, the conductors 24 could be mounted externally of the flexible connection. Moreover, although the elastomer block 18 represents the simplest implementation of a flexible mounting between the member 12 and the barrel part 10, the flexible connection may alternatively be a coiled spring with the conductors or cable passing within the spring. In another alternative, the elastomer block could be replaced by one or a series of articulated joints. The flexible coupling permits the test instrument to be held with an indicating face of the barrel part uppermost regardless of the orientation of the wall-mounted socket.

The barrel part 10 has a channel section plastic molding 34 and a molded cover plate 36. At the front of the channel section 34 is an upstanding flange 38. A rear part 40 of the elastomer block 18 is anchored behind the flange 38 and a corresponding downwardly extending flange 42 at the front of the cover plate 36. The channel section 34 also has an upstanding flange 44 at its rear end which locates in a groove 46 in the cover plate to fix the channel section 34 and the cover plate 36 in the relative positions shown in FIG. 1.

The cover plate is molded with a series of apertures 48 within depressed regions 50 as shown in FIG. 1. When the parts of the checking instrument are assembled the apertures accommodate lamps 52 in the form of light emitting diodes. Written indicia 54 on the raised parts of the cover plate 36 indicate the identity of the lamp.

Fixed into the base of the channel section 34 is an elongate circuit board 56 on which is mounted the test and indicating circuit including the LED's 52.

Figure 3:
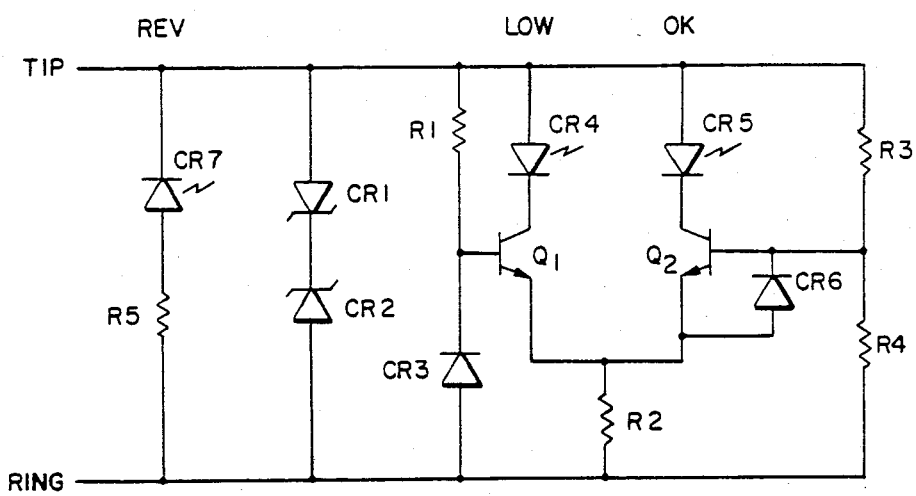
FIG. 3 is a schematic view of an electrical circuit contained within a barrel portion of the FIG. 1 test instrument.

This circuit is shown schematically in FIG. 3.

The circuit is intended to check the condition of tip and ring in the subscriber's loop and indicate immediately to the installer, repairperson or subscriber:

(i) whether the tip and ring conductors are properly wired and the subscriber has sufficient loop current to operate the telephone or other type of telephone equipment;

(ii) whether the tip and ring conductors are reversed; or (iii) whether insufficient current is being supplied to the customer's telephone.

As shown in the control indicia on the cover plate and as shown in the FIG. 3 circuit diagram the tests are known respectively as "OK", "REV", and "LOW".

The three test links are each bridged across the tip and ring test rails which are intended to be connected to tip and ring lines of the subscriber's loop via terminals 58 on the circuit board, conductors 24 and abutting contact members 28.

The reverse test link is simply a series connected resistor R5 and red light emitting diode CR7, the diode connected such as to conduct when ring voltage is more positive than tip voltage. The tip and ring "OK" and "LOW" tests are performed by a differential amplifier incorporating transistors $Q_1$ and $Q_2$. A resistance divider network R3, R4 provides a bias to $Q_2$ which is dependant on the tip-to-ring voltage. The divider networ R1, CR3 provides a constant voltage bias to $Q_1$ which is set by the characteristics of zener diode CR3. Because the emitter terminals of the transistors are at a common voltage which depends on R2, then when a positive tip-to-ring voltage is present one of the transistors is forward biased and conducts while the other is reversed biased and does not. The component values are chosen so that $Q_1$ conducts for a tip-to-ring voltage up to 8.6 volts and $Q_2$ conducts at a voltage greater than 8.6 volts. One only of the light emitting diodes CR4 and CR5 in the transistor collector circuits emits accordingly. CR4 and CR5 are colour-coded respectively red and green to accentuate the existence of an acceptable or non-acceptable condition.

The circuit is designed to draw 20 milliamperes when 8.6 volts is present between tip and ring. Thus at the threshold current value of 20 milliamperes, the effective input resistance is 430 ohms, the resistance commonly considered to be the maximum acceptable for an off hook telephone.

Diode CR6 is present to prevent damage to transistor $Q_2$ occurring through high reverse bias. Similarly, back-to-back zener diodes CR1 and CR2 are provided to prevent damage to transistors $Q_1$ and $Q_2$ in the event of an overload voltage across the test terminals.

The specific embodiment described herein relates to test access at a wall mounted socket or jack. However, a test instrument such as that described can be used where the socket or jack member to be accessed is at a location other than the wall of a telephone subscriber's premises. Although the test instrument shows any one of three conditions of the subscriber's loop circuit, the tester must take additional steps to further diagnose at least two results of the test. Thus if the "REV" indicator is lit then the particular reversal may be either at the jack being tested or at the station protection block. To diagnose which of these two situations exist, the tester simply tests the other jacks within the premises. Similarly if the "LOW" indicator is lit, the insufficient current to the customer's phone may be due to a receiver off-hook (ROH) or there may be a short or ground causing the problem. The types of problems might be further identified using a telephone or butt-in and normal trouble shooting procedures using equipment other than the line testing instrument described here. The "LOW" indication may, in fact, not be due to a fault but to an excessively long loop without appropriate loop conditioning equipment.

Although in the context of this embodiment the indicating devices used are light emitting diodes it will be appreciated that alternative electrically energized indicating devices such as liquid crystal cells could be substituted.

The test instrument described hwas a particular application in testing the tip and ring conditions of a telephone subscriber's loop. However it will be appreciated that particular advantages of this test instrument are its simplicity and the fact that regardless of the orientation in which a part of a modular jack assembly has been mounted within a wall, and in spite of the position in the wall, the test instrument offers ready access. The test and indicating circuitry could be designed for testing other types of electrical circuit such as an electrical supply circuit.

What is claimed is:

1. An electrical test circuit for use in testing tip and ring conditions of a telephone subscriber's loop, the circuit comprising: a pair of terminals connectable to tip and ring, respectively, and three separate light emitters connected across the terminals and selectively energizable by loop current, first means for engerizing the first light emitter only in response to a reverse polarity condition of tip and ring, transistor means for energizing the second light emitter only in response to an abnormally low current, forward polarity condition of tip and ring, and transistor means for energizing the third light emitter only in response to a correct loop current, forward polarity condition of tip and ring.

2. A test circuit as claimed in claim 1 in which the light emitters are light emitting diodes.

3. A test instrument as claimed in claim 1 in which the first light emitter is connected in a series with a resistor.

4. A test circuit as claimed in claim 1 in which the third light emitter is connected to the collector of a first transistor, the second light emitter is connected to the collector of a second transistor, and the transistor pair function as a differential amplifier.

5. A test circuit as claimed in claim 4 in which a first divider network connected between tip and ring provides a bias voltage to the first transistor which depends on the tip-to-ring voltage and a second divider network connected between tip and ring provides a substantially constant bias voltage to the gate of the second transistor.

6. A test circuit as claimed in claim 1 in which the light emitters are colour coded.

7. An electrical test circuit for use in testing tip and ring conditions of a telephone subscriber's loop the circuit comprising: a pair of terminals bridges by a pair of back-to-back zener diodes and being connectable to tip and ring, respectively, and three light emitting means connected across the terminals and selectively energizable by loop current, the first light emitting means energized by a reverse polarity condition of tip and ring, the second light emitting means energized by an abnormally low current, forward polarity condition of tip and ring, and the third light emitting means energized by a correct loop current, forward polarity condition of tip and ring.

8. A test circuit as claimed in claim 7 in which the light emitting means are light emitting diodes.

9. A test instrument as claimed in claim 7 in which the first light emitting means is connected in a series with a resistor.

10. A test circuit as claimed in claim 7 in which the third light emitting means is connected to the collector of a first transistor, the second light emitting means is connected to the collector of a second transistor, and the transistor pair function as a differential amplifier.

11. A test circuit as claimed in claim 7 in which a first divider network connected between tip and ring provides a bias voltage to the first transistor which depends on the tip-to-ring voltage and a second divider network connected between tip and ring provide a substantially constant bias voltage to the gate of the second transistor.

12. A test circuit as claimed in claim 7 in which the light emitting means are colour coded.

* * * * *